United States Patent [19]
Rapoport et al.

[11] 4,149,464
[45] Apr. 17, 1979

[54] LITHOGRAPHIC PLATE MAKING AND PRINTING PROCESS

[75] Inventors: Sidney L. Rapoport, Lagrangeville; Douglas F. Mitchell, Brooklyn, both of N.Y.

[73] Assignee: Rapoport Printing Corporation, New York, N.Y.

[21] Appl. No.: 769,056

[22] Filed: Feb. 16, 1977

Related U.S. Application Data

[62] Division of Ser. No. 511,293, Oct. 2, 1974, Pat. No. 4,011,085.

[51] Int. Cl.² .......... B41M 1/18; G03F 5/12; G03F 5/22; G03F 7/02
[52] U.S. Cl. .......... 101/450; 96/33; 96/45; 96/116; 101/211
[58] Field of Search .......... 46/45, 116, 45.2, 33; 101/211, 450

[56] References Cited

U.S. PATENT DOCUMENTS

| | | | |
|---|---|---|---|
| 493,850 | 3/1893 | Woodward | 101/211 |
| 640,469 | 1/1900 | Jacobson | 96/116 |
| 871,234 | 11/1907 | McIntosh | 96/45 |
| 2,048,876 | 7/1936 | Marx | 96/45 |
| 2,096,794 | 10/1937 | Dultgen | 96/45 |
| 2,783,678 | 3/1957 | Andreas et al. | 96/45.2 |
| 2,914,405 | 11/1959 | Consaul et al. | 96/45 |
| 3,130,669 | 4/1964 | Cooke | 101/401.1 |
| 3,132,946 | 5/1964 | Scott | 96/45 |
| 3,222,167 | 12/1965 | VanHeerentals | 96/45.2 |
| 3,345,176 | 10/1967 | Erickson | 96/116 |
| 3,581,660 | 6/1971 | Rapoport et al. | 96/116 |
| 3,655,381 | 4/1972 | Roemer | 96/45 |

*Primary Examiner*—Clyde I. Coughenour
*Attorney, Agent, or Firm*—Mandeville and Schweitzer

[57] ABSTRACT

An improved two printing step process for reproducing visual subject matter including the making of a secondary printing plate with a positive image random pattern screen and printing a substrate sequentially and in registry with the secondary printing plate and a master printing plate made with a conventional half tone screen. The random pattern screen is a positive image phototransparency having a large plurality of irregularly shaped highlight areas and constrasting shadow areas per square inch, an optical density from about 0.17 to about 1.6, a contrast factor from about 0.75 to about 1.5 and a transparency factor from about 0.25 to about 0.60. The random pattern screen is made from a transparent plate having light disruptive projections on its surface. A negative and a positive phototransparency of the transparent plate are made while controlling exposure and developing conditions to produce a positive image screen having the desired characteristics.

8 Claims, 2 Drawing Figures

1/2000"

LITHOGRAPHIC PLATE MAKING AND PRINTING PROCESS

This is a division, of application Ser. No. 511,293, filed Oct. 2, 1974, now Pat. No. 4,011,085 issued Mar. 8, 1977.

BACKGROUND AND PRIOR ART

The invention relates to an improved process for the photolithographic reproduction of visual subject matter having a continuous tone and gradations of tonal value such as wash drawings, photographs and paintings. The invention further provides a flexible contact screen for use in the improved process and a method for producing the screen. More specifically, the present invention defines improvements in the process disclosed in the Applicant's own prior patent, U.S. Pat. No. 3,581,660 granted June 1, 1971, hereinafter referred to as the Rapoport et al patent.

In the Rapoport et al patent, the Applicants describe a process for the photolithographic reproduction of visual subject matter including dual printing steps, each done with a printing plate made by well known photolithographic techniques from a matter and secondary negative produced by exposing the original subject matter to the light source through a patterned transparent screen. The screen used to make the master negative is a conventional half tone screen while the screen used for the secondary negative is a random pattern contact screen. The secondary negative is exposed to the original copy for a longer time interval, under the same lighting conditions to produce a printing plate that when printed in registry with the master printing plate, results in a final reproduction having extraordinary detail in the shadow areas of the original copy.

Other prior art patents disclosing lithographic printing processes including dual printing steps are the Gast U.S. Pat. No. 547,780; McIntosh U.S. Pat. No. 871,234; Weyl U.S. Pat. No. 809,157 and Cooke U.S. Pat. No. 3,130,669. The Gast and Weyl processes are for three color printing using a "stipple" screen for at least one of the printing steps to avoid what is known in the art as the "Moire" effect. In the McIntosh process a first printing step is performed with a printing plate produced from a half tone negative. According to the McIntosh teaching, the first print is overprinted with a printing plate made from a screen negative, i.e., a negative made without the interposition of a screen between the film and the original copy during exposure. The Cooke patent describes a complex procedure for making "screenless" halftone negatives by employing a granular surfaced screen interposed between a treated and bleached continuous tone transparency of the original subject matter and a light source during exposure.

The prior art is replete with random pattern, stipple, grannular, and other types of irregularly surfaced or textured lithographic screens, as distinguished from geometric screens containing a geometric pattern such as the well known square ruled half tone screen and the dot half tone screen such as that described in the Yule U.S. Pat. No. 2,292,313. In addition to the screens disclosed in the aforementioned patents, screens of this type can be found in the following patents, among others: Pearson U.S. Pat. No. 1,945,865; Ewald U.S. Pat. No. 1,710,303; Zoller U.S. Pat. No. 2,082,475; Eckardt U.S. Pat. No. 2,130,735; Morris U.S. Pat. No. 1,161,824 and Great Britain Pat. Specification No. 315,681. The published literature also contains teachings of irregular pattern screens of the types described in the foregoing patents.

Typically, the irregular pattern screens described in the prior art are designed to be placed between a light source and the film used to make the printing plate negative with a definite physical separation between the surface of the screen and the film. Screens of this type are usually rigid materials such as glass or plastic plates having a surface pattern either physically engraved or coated thereon and should be distinguished from flexible contact screens which are designed to be in physical contact with the printing plate negative during exposure to the original copy. Contact screens are typically a flexible photographic transparency of a physically engraved transparent plate; although rigid, physically engraved, contact screens are known in the art.

Of the prior art patents mentioned, only the Applicants' own Rapoport et al patent discloses a flexible transparent random pattern contact screen. The contact screen of the Rapoport et al patent is described as a negative phototransparency having a fine irregular pattern, including randomly disposed irregularly shaped areas.

It is a primary objective of the present invention to define specific improvements in the process described in the Applicant's prior Rapoport et al patent.

It is a further objective of the invention to provide an improved contact screen for use in the improved process.

A still further objective of the invention is to provide a process for making the improved contact screen.

DESCRIPTION OF THE INVENTION

The foregoing and other objectives of the invention are achieved by a photolithographic reproduction process employing a new random pattern contact screen, in a two printing step process of the type described in the Rapoport et al patent. The use of the new screen simplifies the prior process, making it more feasible for high speed commercial use and resulting in a superior final print.

The improved process includes the production of a master printing plate and a secondary printing plate from master and secondary negatives by photolithograph techniques well known in the art. The two printing plates are substantially different, the master plate being made from a master half tone negative exposed through a standard square grid half tone screen while the second printing plate is made from a secondary negative exposed through a random pattern screen according to the invention. The final reproduction of the invention is obtained by sequentially printing with both printing plates on a substrate in registry. Although the order of printing is not critical it is preferred to print first with the master printing plate and to overprint with the secondary printing plate.

In accordance with a specific aspect of the invention, the secondary negative used in making the secondary printing plate is made by exposing a photographically sensitive surface to visual subject matter with the new contact screen overlying the photographically sensitive surface, for a time interval substantially, if not exactly, the same as the exposure time interval utilized in making the half tone or master negative. By not requiring a different exposure time for the master and secondary negatives, as in the prior art, the new process is substantially less complicated to practice and a commercial reproduction plant employing the new process can be operated by relatively unskilled technicians. Further, the new process can be run at higher rates of production and at less cost with an improved final product relative to the prior art process.

The foregoing advantages are achieved by the use of a new contact screen in a two printing step process for lithographic reproduction. The new contact screen can be characterized as a positive image photographic transparency having disposed therein a large plurality, preferably at least about 50,000 to 100,000 and as many as 250,000 or more irregularly shaped highlight areas per square inch of screen surface. The irregularly shaped highlight areas, hereinafter referred to as highlight areas, are positive photographic images in a random pattern. Contrasting areas are interposed between highlight areas and are present in about the same concentration (areas/sq.in.) as the highlight areas. The highlight areas have greater light transmission properties than the contrasting areas; however, the grey tone of the screen varies within the highlight and contrasting areas as well as between them, as will be further described hereinafter.

Before proceeding with the description of certain important characteristics and properties of the new contact screen, a number of terms for expressing these characteristics will be defined. The optical density or density of a grey tone is a commonly used term to express the darkness, i.e., closeness to black or opacity or lightness, i.e., closeness to white or clarity of the tone. When the term optical density or density is used in describing an image having gradations of tonal values, the term refers to a particular point of the image or area of the image having a constant, single tonal value throughout.

Optical density is a well known concept in the graphic arts and is typiccally and most commonly expressed as a reading on the Grey Scale. The Grey Scale assigns numerical values to grey tones from a value of 0 for the complete absence of grey, i.e., pure white or a clear transparency to a value of 3.0 for black. A printed scale of grey tones, known in the art as the MacBeth Grey Scale is distributed by and available from the MacBeth Company, Division of Killmorgen Corporation, P.O. Box 950, Newburgh, New York 12550. The printed Macbeth Scale is inherently limited in its range of grey tones since it is a printed reproduction, and extends from a value of 0.05 to 2.1. Typically high quality half tone reproductions are excellent in reproducing densities lighter than 1.5 on the Grey Scale but are lacking in the dark or shadow areas having a density greater than 1.5.

The MacBeth Company also manufactures a line of reflection and transmission densitometers, which are automatic photoelectronic instruments for measuring the density of either opaque or transparent images respectively in terms of a reading on the Grey Scale. The densitometer instruments manufactured and sold by the MacBeth Company and other companies are commonly used quality control instruments in the graphic arts industry and densitometer readings are the accepted standard for evaluating the quality of printed reproductions.

It should be understood that when the density of an opaque surface is specified, the given reading is made on a relfection densitometer and on a transmission densitometer when the reading is for a transparent material.

The transparency factor of a transparent material having a grey tonal image, is defined as the overall or "average" optical density of the image measured on the Grey Scale by a light transmission densitometer. The measured material can be of a single optical density throughout, in which case the transparency factor is that optical density, or the material can have areas and points of different densities such as the screens of the invention in which case the transparency factor is an "average" measure of the overall density measured by projecting light through a representative area of the image and taking a single reading on an appropriate densitometer.

As used herein, the term contrast factor denotes the range of grey tones present in the image being measured, the contrast factor of a surface having the same optical density throughout being zero. The contrast factor can be defined as the difference between the highest and lowest density found on a measured surface. For example, a transparent image having relatively clear areas, i.e., an optical density of about 0.05 and relatively black areas, i.e., an optical density of about 2.0, would have a contrast factor of 1.95.

The lower the absolute value of the contrast factor of a material having varying grey tones, the less contrast the material appears to have when visually examined. On the other hand, the transparency factor of an image is a measure of its overall light or dark appearance; the higher the transparency factor, the darker or blacker the material appears. It should be realized that materials can have the same contrast factor with significantly different transparency factors and vice versa. The specification of both the transparency factor and contrast factor for a grey phototransparency is therefore an accurate measure of its optical characteristics and appearance and would permit one skilled in the art to reproduce the image without undue experimentation.

In accordance with an important aspect of the invention, it has been discovered that when the contact screen described herein is used in a two printing step lithographic process of the type described in the Rapoport et al U.S. patent, the process is unexpectedly simplified by permitting the same exposure time interval to be used in making both the master and secondary negative. The prior art step of determining when the secondary negative is properly exposed is eliminated and the need for a skilled technician to make this determination is done away with.

The new contact screen can be defined in terms of transparency and contrast factors and other characteristics. The contact screen of the invention is a positive image, flexible, phototransparency having a photographic pattern of highlight and contrasting areas dispersed in a random manner throughout. The highlight areas have a lower transparency factor than the contrasting areas which separate the highlight areas. The screens of the invention have a transparency factor of about 0.25 to about 0.60 and a contrast factor of about 0.75 to about 1.5. Preferably, the optical density of the new screens can vary from about 0.17 at the lightest point to about 1.6 at the darkest point.

In accordance with a specific aspect of the invention, the highlight areas of the new screen have tonal gradations from their periphery to their central region; the lowest densities of the screen being found in the central region of the highlight areas. Similarly, the contrasting areas have differing optical densities relative to each other and tonal gradations within any particular contrast area. The points of highest density in the new screen are found in the contrasting areas.

In further accordance with a specific aspect of the invention, improved final prints can be obtained when a contact screen, according to the invention, having at least about 100,000 and as many as about 250,000 highlight areas per square inch of screen surface and about the same concentration of contrasting areas, is used in the new two step printing process.

The new screens can be made by first exposing a photographically sensitive film surface to a diffused light source with a transparent plate having a physically inscribed pattern on at least one of its surfaces interposed between the light and the film. The transparent plate can be a glass plate that has been acid etched to inscribe both surfaces with a rough texture comprising a large number of light disruptive projections and depressions which create shadowed areas when diffused light passes through the plate and onto a photographically sensitive film surface. The film is exposed to the light source through the plate for a time interval adequate to result in a transparency factor greater than about 1.5, and less than about 2.0, preferably from about 1.6 to about 0.8, when developed as a negative transparency to have a contrast factor less than about 1.5 and greater than 1.0, preferably from about 1.2 to about 1.4. The density of the negative transparency can vary from 1.0 to about 2.5.

Preferably, the exposure time interval to make the negative transparency of the transparent plate is performed in two segments with the plate being rotated from about 90° to about 180° or the equivalent thereof between time segments, in order to obtain a final screen with the desired concentration of highlight areas. The concentration of highlight areas will be approximately twice the number of light disruptive projections on the surface of the transparent plate which is usually about 50,000 per square inch. Preferably, the second segment of the exposure time interval is about twice as long as the first segment.

The negative transparency of the transparent plate is then interposed between another photographically sensitive film surface and a diffused light source and an exposure is made for a sufficient time interval to result in optical density from about 0.17 to about 1.6 for the developed positive image phototransparency and a transparency factor from 0.25 to 0.60. The exposed surface is developed in the ordinary manner well known in the art to produce a phototransparency having a contrast factor from about 0.75 to about 1.5. The resulting phototransparency is a positive image of the transparent plate.

The exposure to produce the negative and positive transparencies of the plate can be, and preferably are, made by direct exposure to the light source without the interposition of a camera lens.

With regard to the foregoing description of the method for making the screens of the invention, it should be appreciated that the transparency factor of either the initial negative transparency or final positive transparency is a direct function of the time of exposure to the diffused light source and the intensity of the light source. Similarly, the contrast factor of the negative and positive image transparencies is a direct function of the developing process, particularly the time the photographically sensitive surface is in the developer solution. The foregoing parameters, which determine the ultimate characteristics of the new screens, can, of course, be varied and equivalents substituted to result in an equivalent positive image screen. The new screens, produced according to the invention, are durable and can be repeatedly used in lithographic reproduction processes.

BRIEF DESCRIPTION OF THE DRAWING

The process and article of the invention will be described in further detail with reference to the accompanying drawing in which.

DESCRIPTION OF PREFERRED EMBODIMENTS

Figure 1:
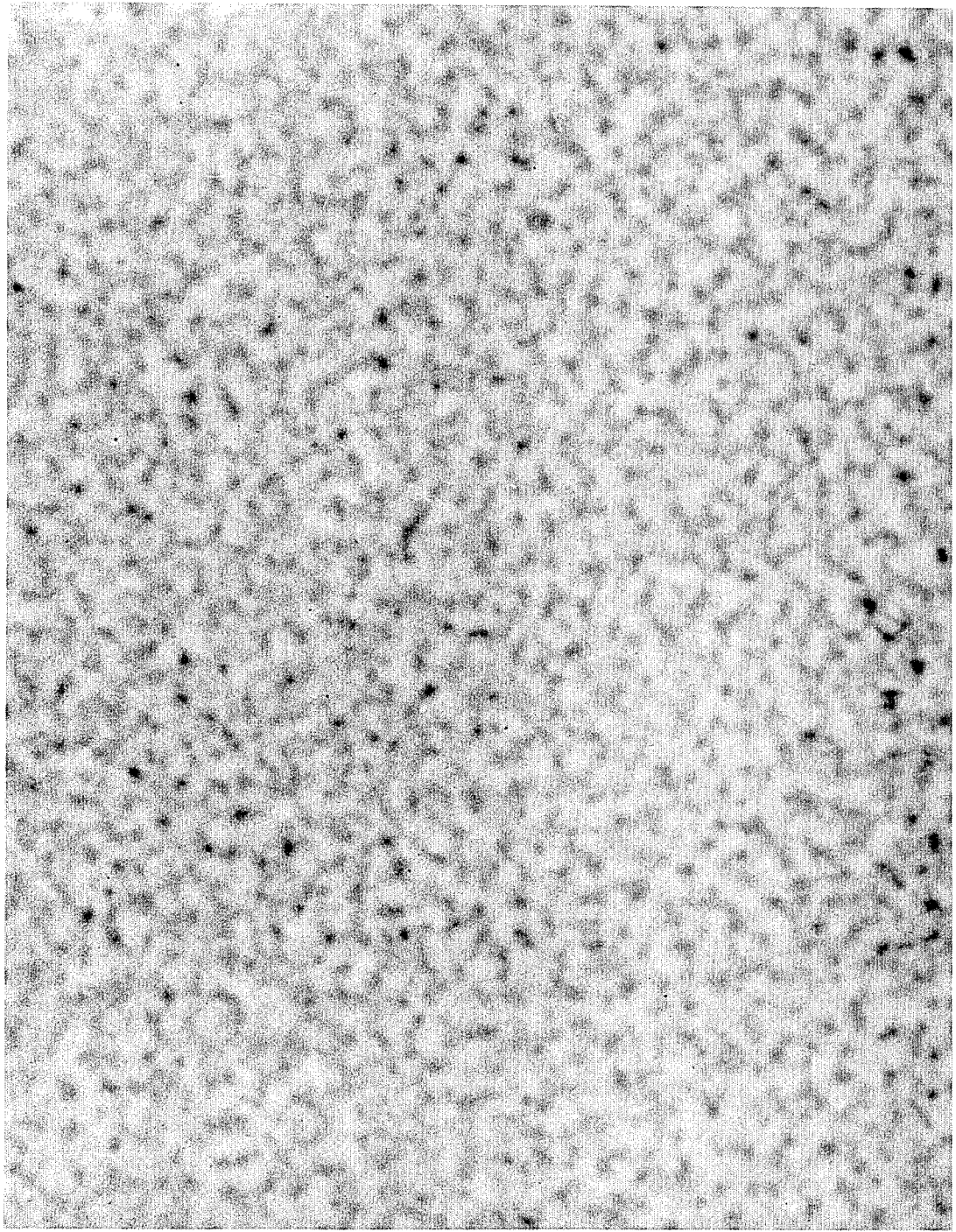
FIG. 1 is a photomicrograph of a secondary screen according to the invention, enlarged as indicated to clearly show the tone gradations and random distribution of the highlight areas and contrasting areas, and, FIG. 2 is a photomicrograph of a portion of the screen shown in FIG. 1 enlarged as shown to show the tonal gradations and configuration of individual highlight areas and contrasting reas of the secondary screen.

Referring to FIG. 1 of the drawing, a preferred secondary screen according to the invention is shown. The illustrated screen is a positive image photographic transparency having distributed therein a large plurality of highlight and contrasting areas of varying tonal values per square inch of screen surface, typically greater than about 50,000. The highlight and contrasting areas are a positive photographic image, of a transparent plate that has at least one physically irregular surface, including a large plurality of light disruptive projections. As shown in FIG. 1, the contrasting areas separating the highlight areas have a greater optical density as measured on the Grey Scale than the highlight areas. Accordingly, the contrasting areas have lower light transmission properties than the highlight areas. The transparency factor of the illustrated screen is about 0.52, the contrast factor is about 1.3 and the optical density varies from about 0.22 to about 1.52.

Figure 2:
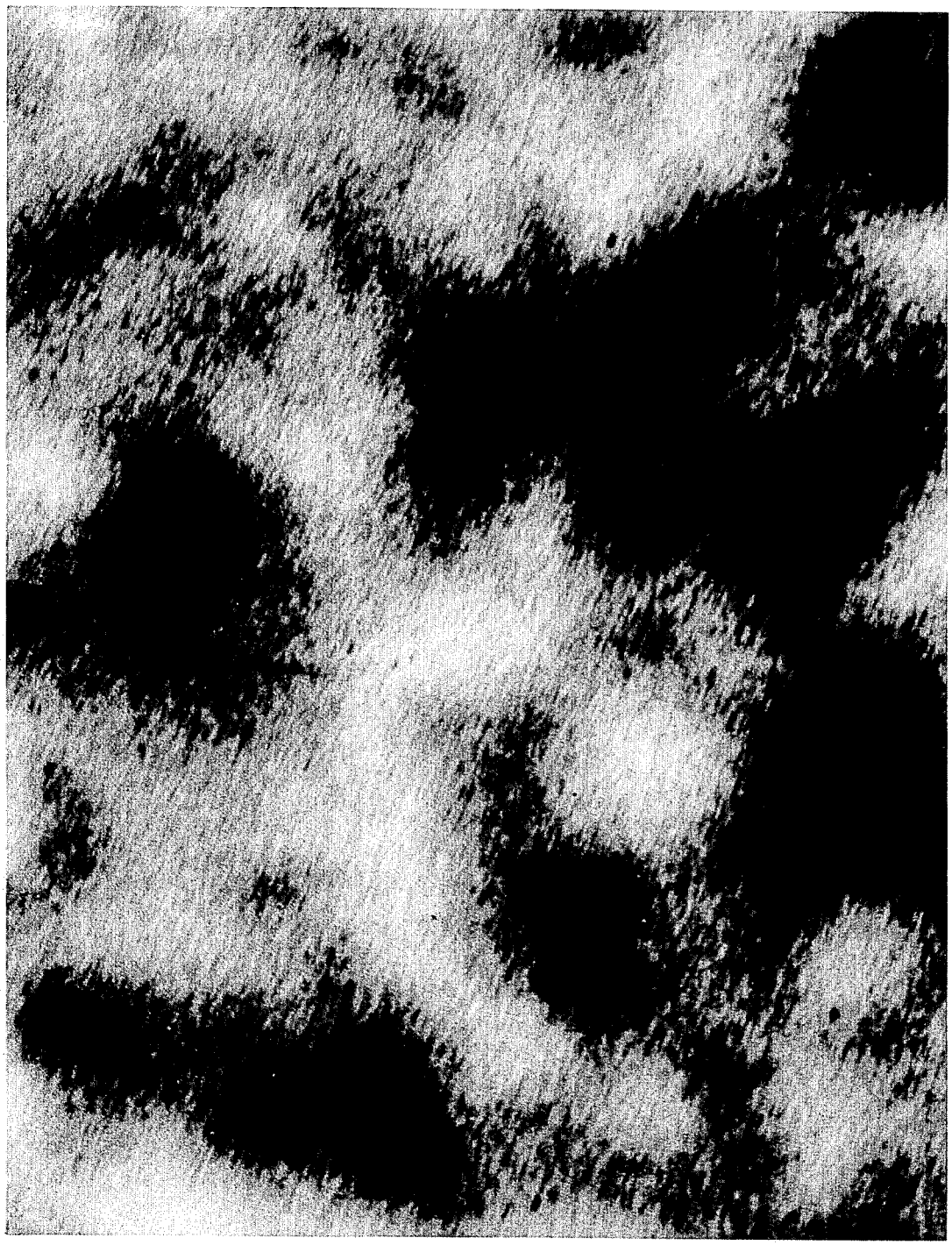

FIG. 2 shows the tonal gradations within a number of individual highlight and contrasting areas. As shown best in FIG. 2, the periphery of the highlight areas is indistinct, i.e., there is not a sharp line of demarcation between the contrasting areas and the highlight areas.

In accordance with a specific aspect of the invention, the highlight areas vary in tone from their periphery to their central portion. Typically, the optical density of the highlight areas decreases from a maximum value at the periphery to a minimum value at the central portion. Similarly, the contrasting areas vary in tone from their periphery to their central region; the higher densities being found in the central region.

The screen shown in FIGS. 1 and 2 can be made in accordance with a further aspect of the invention, as follows. A transparent glass plate is etched on both sides by immersing it in hydrofluoric or other suitable inroganic acid for a sufficient time to result in a granular surface having at least about 50,000 light disruptive projections on each side. The etched glass plate is placed in contact with the emulsion side of a sheet of continuous tone black and white film of the ortho-type that is commercially available under the trademark KODAK and others. The film and plate are held in an open face vacuum frame, placed on a horizontal surface and exposed to a 7 watt coated light bulb located about 7 feet above the horizontal surface for about 2 seconds. The plate is then rotated 180° with respect to the film and once again exposed to the light source; this time for about 4 seconds. The foregoing exposure times can be varied for different intensity light sources and distances, but should remain in the approximate ratio of 1:2 respectively. The exposed film is removed from the plate and developed in a continuous tone developer using techniques well known in the art to produce a negative image phototransparency. The negative image transparency is developed until a contrast factor of about 1.3 is attained, the optical density varying from about 1.07 to about 2.38. The negative image transparency has a transparency factor of about 1.8. It should be noted that the transparency factor is a direct function of the exposure of the film to the light source, i.e., exposure time, intensity of light source and distance of light source from the film, while the contrast factor is a function of the development process, primarily immersion time in the developer solution. Generally, the film is exposed to result in a negative image transparency having the desired transparency factor after being developed to have the desired contrast factor.

The negative image transparency produced in the foregoing manner is placed in an open face vacuum frame in contact with the emulsion side of a second sheet of continuous tone black and white film. The second sheet of film is exposed to the same lighting conditions as the first film, except for an exposure time of about 10 seconds and developed to a contrast factor of about 1.3 with a density from about 0.22 to about 1.52. The exposure is sufficient to result in a transparency factor of about 0.52 when the film is developed to the desired contrast factor. The resulting positive image phototransparency is the screen shown in FIGS. 1 and 2. It should further be noted that the foregoing procedures for making the preferred screen of the invention can be varied and equivalent techniques used to produce a positive image transparent screen having the characteristics previously defined.

A preferred technique for using the new screen to produce improved reproductions of visual subject matter includes a two printing step process. One printing step is done with a printing plate made from a conventional half tone negative and the other from a printing plate made from a negative exposed to the original copy through a new screen according to the invention. The order of printing is not important; however, for clarity of description, the half tone negative and printing plate will be prefaced by master while the new negative and printing plate will be referred to as secondary.

The master negative is made by exposing a first photographically sensitive surface, such as KODAK MP litho film, to the visual subject matter to be reproduced with a typical, commercially-available 200 line screen interposed between the film and light source. The usual exposure time is from about 10 to 20 seconds, typically 15 seconds. The exposed film is developed to form the master negative. A master printing plate is made from the master negative and a suitable metallic substrate, preferably aluminum, by photopolymeric techniques that are well known in the art.

The secondary negative is made by exposing a second photographically sensitive surface, such as KODAK MP litho film to the visual subject matter with a positive image random pattern screen according to the invention in physical contact with the emulsion surface of the film. Preferably, and in accordance with a specific aspect of the invention, the secondary negative is made under substantially the same exposure conditions used in making the master negative, i.e., exposure to the same light source under the same conditions for about the same time of 10 to 20 seconds, preferably about 15 seconds.

Preferably the second film surface is prefogged prior to exposure to the visual subject matter to increase its speed and sensitivity. The prefogging step typically includes exposure of the film to a very dim light source, such as an 8 watt bulb for a short period of time, i.e., 1 to 2 seconds.

The secondary printing plate is made from the secondary negative and a suitable metallic substrate, preferably aluminum by photopolymeric techniques well known in the art.

An important characteristic of the improved lithographic printing process described herein is the utilization of substantially the same exposure conditions for the production of the master and secondary negatives. This advantage permits the process to be operated on a semi-automated basis by relatively unskilled operators and results in greater efficiency and more consistant and duplicatable results. The foregoing advantageous characteristic is based on the discovery, as set forth herein, that by utilizing the positive image contact screens of the invention in the new method, the exposure conditions for both master and secondary negatives can be substantially the same. As described hereinable, the procedures for making the master and the secondary printing plates from the original copy or visual subject matter are virtually identical.

The final printed reproductions are produced by sequentially printing a suitable substrate, typically paper, with each of the master and secondary printing plates in registry. It is preferred to print first with the master printing plate although similar results are obtained when the order of printing is reversed. The printing can be performed on a standard lithographic printing press of the type in common usage.

The final prints obtained by the improved process show startling detail, relative to a high quality half tone print, particularly in the dark shadow areas of the original copy, i.e., those areas having a density greater than about 1.5. The final prints according to the invention include the outstanding shadow detail of the prints made by the process described in the Rapoport et al patent and in many cases show improved middle tone reproduction. Frequently, improved and visually discernable shadow details are also obtained in prints produced by the new method. The new method permits the lithographer to obtain at least the same outstanding results of the prior art process in a more efficient and simplified manner.

It should be understood that the specific form of the invention hereinabove described and illustrated is intended to be representative only, as certain modifications within the scope of this teaching will be apparent to those skilled in the art of lithographic reproduction. Accordingly, reference should be made to the following claims in determining the full scope of the invention.

We claim:

1. In a process for the photolithographic reproduction of visual subject matter including the steps of printing a substrate with a first printing plate produced by photolithographic techniques from a halftone negative of said visual subject matter, printing said substrate with a second printing plate produced by photolithographic techniques from a second negative of said visual subject matter made through a random pattern screen, both of said printing steps being in registry to produce a single image of said visual subject matter, said photolithographic techniques including the exposure of said halftone and second negative through a halftone screen and a random pattern screen respectively, the improvement characterized by exposing said second negative through a random pattern schreen that is a photolithographic transparency having randomly dispersed therein a large plurality of irregularly shaped areas of relatively high light transmission, said photographic transparency having a contrast factor of about 0.75 to about 1.5, and said large plurality being at least about 100,000 per square inch, said exposure of said second negative to said visual subject matter being for substantially the same time interval as the exposure of said halftone negative to said visual subject matter.

2. The method of claim 1, wherein said random pattern screen has an optical density from about 0.17 to about 1.6.

3. The process of claim 2, wherein the optical density of said irregularly shaped areas gradually decreases from said periphery to the central region of said irregularly shaped areas.

4. The method of claim 1, further including the step of prefogging said second photographically sensitive surface.

5. The method of claim 1 wherein said random pattern screen has a transparency factor from about 0.25 to about 0.60.

6. The method of claim 1 wherein said random pattern screen has a transparency factor from about 0.25 to about 0.60, an optical density from about 0.17 to about 1.6 and wherein said areas of relatively high light transmission are defined by an indistinct periphery and an optical density that varies from the central region to said outer periphery.

7. The method of claim 6 wherein the optical density of said irregularly shaped areas gradually decreases from said outer periphery to said central region.

8. The method of claim 6 wherein said random pattern screen is a positive image photolithographic transparency.

* * * * *